US006903664B2

(12) United States Patent
Schröder et al.

(10) Patent No.: US 6,903,664 B2
(45) Date of Patent: Jun. 7, 2005

(54) METHOD AND APPARATUS FOR ENCODING AND FOR DECODING A DIGITAL INFORMATION SIGNAL

(75) Inventors: Ernst F. Schröder, Hannover (DE); Johannes Böhm, Göttingen (DE)

(73) Assignee: Thomson Licensing S.A., Boulogne-Billancourt (FR)

( * ) Notice: Subject to any disclaimer, the term of this patent is extended or adjusted under 35 U.S.C. 154(b) by 0 days.

(21) Appl. No.: 10/372,515

(22) Filed: Feb. 24, 2003

(65) Prior Publication Data

US 2003/0167165 A1 Sep. 4, 2003

(30) Foreign Application Priority Data

Mar. 1, 2002 (EP) ............................................ 02090083

(51) Int. Cl.[7] ................................................ H03M 7/00
(52) U.S. Cl. ........................................... 341/50; 341/67
(58) Field of Search ............................... 341/50, 67, 65

(56) References Cited

U.S. PATENT DOCUMENTS 5,844,600 A 12/1998 Kerr ............................ 348/17
5,905,768 A 5/1999 Maturi et al. ............... 375/364

FOREIGN PATENT DOCUMENTS

WO WO 02/17302 A2 2/2002 ........... G10L/19/14

*Primary Examiner*—Peguy JeanPierre
(74) *Attorney, Agent, or Firm*—Joseph S. Tripoli; Ronald H. Kurdyla; Joel Fogelson

(57) ABSTRACT

Original digital audio signals are represented as PCM sample values wherein the distance between the values corresponds to the sampling frequency. Digital signals can have a length that is an integer multiple only of this time element. In particular coded digital audio signals are processed block-based, leading to a total length that is a multiple only of the block unit. According to the invention, information about the exact length of the original signal is transferred together with the encoded audio information. Additionally, an information value can be transferred that represents the total encoder and/or decoder delay. The decoder extracts these items of information and adjusts the total length of the decoded signal by cutting off samples from the decoded program or track.

17 Claims, 2 Drawing Sheets

METHOD AND APPARATUS FOR ENCODING AND FOR DECODING A DIGITAL INFORMATION SIGNAL

FIELD OF THE INVENTION

The invention relates to a method and to an apparatus for the bitrate-reducing encoding and decoding of information, in particular digital audio signals.

BACKGROUND OF THE INVENTION

The digital representation of analog audio signals has a time structure that originates from the sampling process. Digital audio signals represented in PCM format consist of a sequence of values, wherein the distances between the values correspond to the sampling frequency. That distance is the shortest element of the signal by which the signal can be defined in the time domain. Digital signals can have a length that is an integer multiple only of this time element.

SUMMARY OF THE INVENTION

Encoders and decoders reducing the bitrate of a digital audio signal (like MPEG1/2/4-Audio, Dolby Digital AC-3, mp3, ATRAC, Windows Media Audio WMA or Real Audio) typically operate with short-time frequency-domain representations of the signal. In order to convert the signal into this domain, typically a number—e.g. 128, 256, 512, 1024 and 1152—of signal elements are grouped together—denoted as frames or blocks—and thereafter transformed into the frequency domain. When encoding a signal of arbitrary length, a typical audio coder either discards some part of the audio signal at its end or fills up the audio signal with a number of zero-valued samples (stuffing bits). As a result, the length—i.e. the quantity of samples or coefficients—of any encoded or decoded audio signal can be a multiple only of a further multiple of the initial time element mentioned above, i.e. a multiple of the frame or block length that is required by the encoding or decoding process. Therefore en-coded/de-coded digital audio signals rarely do have the same length as the original audio signal. This difference in lengths can be very annoying when audio signals are to be edited or combined with precise timing.

A problem to be solved by the invention is to provide a block-based encoded/decoded audio signal that has the original arbitrary length or quantity of sample values, in order to enable exact cutting or splicing.

According to the invention, information about the exact length of the original signal is transferred together with the encoded audio information when broadcasting or when recording on or replay from a storage medium. This length value information is available during the encoding process and is inserted into the encoded audio bit stream. Insertion is made using e.g. the ancillary data field as defined in the MPEG Audio standard ISO/IEC 11172-3. The length information sent can have different forms:

- absolute number of audio samples of the program or track or encoding unit;
- number of audio frames of the program or track or encoding unit, and number of samples in the last frame;
- number of samples to be cut off at the start and/or at the end of the program or track or encoding unit.

Additionally, an information value can be transferred that represents the total encoder and/or decoder delay.

The decoder can extract these items of information and adjust the length and the begin of the decoded signal by cutting off samples at the start and/or at the end of the program or track or decoding unit output.

The invention allows decoding an audio or other information signal with a length that matches exactly the original length of the audio or information signal, thereby enabling exact cutting and splicing of the audio or information signal.

In principle, the inventive encoding method is applied to a digital information signal—e.g. an audio signal—having an arbitrary number of original sample values for a specific program or track and thus having an arbitrary length, wherein the encoding operation is based on value blocks related to said sample values, said value blocks each containing multiple values, wherein the encoded digital information signal is output as a code that, when correspondingly decoded, represents a decoded digital information signal having a total length of multiple units corresponding to the length or lengths of said value blocks, and wherein data representing said original sample values arbitrary-length number

- are supplementing at least one frame of said encoded digital information signal output code, for example the last frame or the penultimate frame of said encoded digital information signal,
- or are repeatedly arranged in said encoded digital information signal.

In principle, the inventive decoding method is applied to an encoded digital information signal—e.g. an audio signal—having an arbitrary number of original sample values for a specific program or track and thus having an arbitrary original length, wherein the decoding operation is based on value blocks related to said sample values, said value blocks each containing multiple values, wherein the encoded digital information signal is input as a code that after decoding represents a decoded digital information signal having a length of multiple units corresponding to the length or lengths of said value blocks, and wherein data representing said original sample values arbitrary-length number and supplementing frames of the encoded digital information signal input code, for example the last frame or the penultimate frame of said encoded digital information signal, or being repeatedly arranged in said encoded digital information signal, are used for limiting the block unit based total length of the decoded digital information signal to said arbitrary original length.

In principle the inventive apparatus for encoding a digital information signal—e.g. an audio signal—having an arbitrary number of original sample values for a specific program or track and thus having an arbitrary length, said value blocks each containing multiple values, includes:

- means for encoding said digital information signal, wherein the encoding operation is based on value blocks related to said sample values and which output the encoded digital information signal as a code that, when correspondingly decoded, represents a decoded digital information signal having a total length of multiple units corresponding to the length or lengths of said value blocks;
- means for providing data representing said original sample values arbitrary-length number;
- means for supplementing at least one frame of said encoded digital information signal output code with said data representing said original sample values arbitrary-length number, for example the last frame or the penultimate frame of said encoded digital information signal,
- or means for arranging repeatedly in said encoded digital information signal said data representing said original sample values arbitrary-length number.

In principle the inventive apparatus for decoding an encoded digital information signal—e.g. an audio signal—having an arbitrary number of original sample values for a specific program or track and thus having an arbitrary original length, includes:

- means for decoding said encoded digital information signal, based on value blocks related to said sample values, said value blocks each containing multiple values, wherein the encoded digital information signal is input as a code that after decoding represents a decoded digital information signal having a length of multiple units corresponding to the length or lengths of said value blocks;
- means for extracting from frames of said encoded digital information signal code, for example from the last frame or from the penultimate frame of said encoded digital information signal, data representing said original sample values arbitrary-length number;
- means for providing said means for decoding with information derived from said arbitrary-length number data for limiting the block unit based total length of the decoded digital information signal to said arbitrary original length.

BRIEF DESCRIPTION OF THE DRAWINGS

Exemplary embodiments of the invention are described with reference to the accompanying drawings, which show in.

DETAILED DESCRIPTION OF PREFERRED EMBODIMENTS

Figure 1:
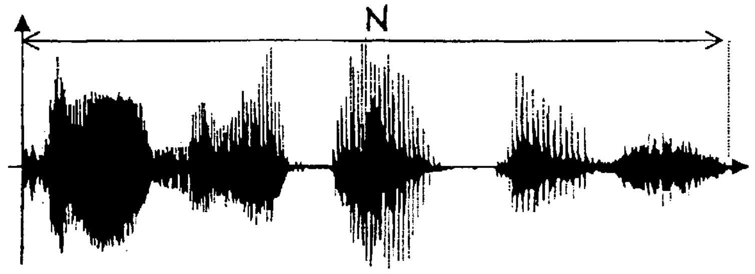
FIG. 1 Original audio signal having a length of n sampling values.

In studio sound or audio processing the available analog audio signals (e.g. at the output of microphone amplifiers) are converted into digital signals, applying the principles of sampling and quantisation. 'Sampling' means that signal amplitude values are taken in regular intervals. The reciprocal value of the temporal intervals is the sampling rate. According to the Nyquist or sampling theorem the original content of the sampled signals can be recovered error-free, if they contain maximum frequencies up to half the sampling rate only. Typical sampling rates used in audio processing are e.g. 44.1 kHz or 48 kHz, which correspond to sampling intervals or clocks of 22.67 μs or 20.83 μs, respectively. 'Quantisation' means that a reduced quantity of amplitude values is assigned to the basically finely resolved signal sample values, according to a quantisation characteristic. Thereby the resolution of the amplitude values becomes limited and the irreversible loss of information detail in the correspondingly inverse quantized values cannot be avoided. For example, a 16-bit amplitude value range extends from −32768 to +32767, and is also called 16-bit quantisation or 16-bit PCM (pulse code modulation). A two-channel audio signal that was sampled with 44.1 kHz sampling frequency and quantized with 16 bits leads to 1411200 bits per second to be processed. 16 bits correspond to 2 bytes, a value which can be easily handled in typical computers or microprocessors. Due to the byte-based processing and the relatively high sampling frequency and thus high time resolution, cut and insert processing can be carried out without problems when editing such digital audio signals.

The disadvantage of the high data quantities to be processed is apparent when transferring and storing such signals.

Therefore the above-mentioned data reducing methods are applied, which perform suppression of redundant as well as irrelevant signal components, based on psycho-acoustic laws. Data reduction factors of 10 or more can be achieved.

The data reduction effect is achieved more effectively, if the signals are represented and processed in the frequency domain that is entered either by short time frequency transformation (e.g. short time fast Fourier transformation FFT) or by multi-frequency band filtering called subband filtering. The result of both kinds of operations is a representation of the audio signal as a temporal sequence of short time spectra. In the decoder, a corresponding inverse transformation or inverse subband filtering, respectively, is carried out in order to re-enter the time domain.

The transformation is usually carried out on input sample blocks having lengths that fully or partly correspond to an integral power of '2', e.g. 128, 256, 512, 1024 or 1152 values as mentioned above, because of computational simplification. Most data reduction coder and decoder types further operate with blocks overlapping in the time domain.

When using overlapping blocks, the total length values possible are an integral multiple of a section of the block length, e.g. an integral multiple of one half of the block length.

In subband coders a split into e.g. 32 frequency bands is carried out, and blocks of sampling values are likewise formed. E.g. MPEG Audio Layer3 (mp3) codecs use a block length of 1152 sampling values, corresponding to a time period of 24 ms at 48 kHz sampling rate.

The resulting coded signal representations are arranged in corresponding frames according to standardized rules, whereby the frames contain strongly signal-dependent binary signals. These frames usually contain sections with important control information (e.g. data packet header information with, side information) and sections with less important however strongly signal-adaptive frequency coefficient information called 'main information'. Because the quantity of information to be transmitted varies strongly depending on the audio signal characteristic and practically never completely fills the capacity of the frames, the frames can also contain parts that represent no standardized useful information. These parts are called for instance 'ancillary data' and can be used freely for different purposes.

One task of the encoder is therefore controlling the coding such that the amount of coded data just fits the frames, i.e. does not exceed the given maximum datarate but makes full use of it. This is mainly achieved by adjusting the coding quality, e.g. the coarseness of the quantisation. The coder can be controlled such that a desired amount of the total datarate is kept for ancillary data.

When decoding (after storage or transfer) the correspondingly inverse processing takes place on the frames/blocks.

When applying above coding/decoding principles, two problems arise that strongly limit in particular the use of the decoded sound signal for editing:

a) Due to the block-based short time transform processing, or the use of filters for splitting the signal into frequency bands, a delay of the decoded audio signal will be introduced. For example, for an audio signal consisting of a single sample value $s_0$ at time instant $t_0$, after encoding and decoding a signal appears at the decoder output that likewise consists of an individual sample value $s_0$, this sample value however no longer being located at time instant $t_0$ but being shifted by some hundred sampling clocks. Such encoding delay is on one hand dependent on the type of the subband filters or the transform length used, on the other hand depending on the construction of the encoder circuitry or software. For example, encoders require a certain pre-processing time before being able to adjust adaptive processes like quantisation step size correctly.

b) Apart from the encoder and/or decoder delay, the block-based processing leads to total length values of the decoded audio signals that are an integral multiple of the block length used and thus do not correspond to the original total length.

If the above-described coding procedures are used in continuously operating transmission circuits, e.g. in broadcasting or in microwave links between broadcasting studios, the basic delay and the blocked structure do not impose a serious problem. However, if the audio signals are stored in coded form on data carriers with certain data lengths (as 'files'), both problems are particularly unfavourable when cutting and editing the audio signals. Contrary to the short cutting/editing time units of approximately 20 $\mu$s available with PCM Audio signals, here only time units are present that are about 500 or 1000 times longer. Thereby the typical cutting and editing processes can be carried out in a limited fashion only.

To solve these problems, the following is supposed to be known:

The construction-dependent basic delay of the combination of encoder and decoder;

The total length of the audio program or track at the input of the encoder, e.g. the number of samples in a PCM file representing the audio signal.

According to the inventive solution, the basic delay value and the total length value are signalled to the decoder. This signalling can be performed by any means, for instance in a separate file or channel, preferably however together with the encoded data in the same data stream or data file, e.g. as 'ancillary data' or additional header data.

The decoder is designed such that it calculates at the start of decoding a certain number (corresponding to above basic delay value) of samples in the usual way but does not output these samples.

Furthermore the decoder is designed such that it initially calculates the audio signal at the end of the program or track in the usual way, but thereafter the output audio signal is limited in its total length corresponding to the transferred information on the total length value.

Advantageously, the transfer of the additional information, i.e. the basic delay value and the total length value, occurs within the ancillary data area. If necessary, the encoder must be controlled such that it reserves enough data capacity for the additional information.

Advantageously, the information about the basic delay is transmitted in the first frame or in one of the first frames. Advisable is transmitting it as a quantity of samples that are to be removed at the beginning. Transmitting this information repeatedly can also be an advantage.

The information about the total length value can be sent in different ways and at different locations within the Data stream or file, e.g. as a quantity of samples that are to be removed from the initially calculated end, or as a quantity of relevant samples within the last data frame, or as an absolute quantity of samples for the total length. This information can be transmitted in the first frame or in one of the first frames or within a later frame, e.g. the last or the second last frame. Transmitting this information repeatedly can also be an advantage.

Advantageously, the basic delay value and/or the total length value are preceded or initiated by an identification data pattern, and are protected by error protection data, e.g. a CRC check.

In FIG. 1 an audio signal is depicted that has a length of N samples, N being an integer number.

Figure 2:
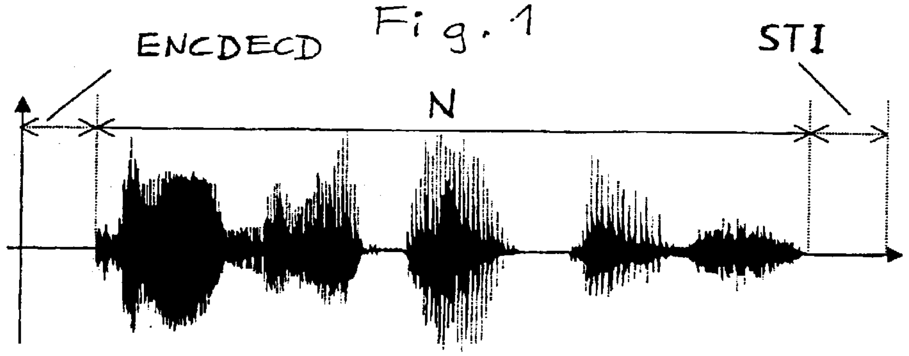
FIG. 2 The audio signal at decoder output, including the n sampling values, the encoder/decoder delay and stuffing information.

In FIG. 2 the audio signal output from the decoder has a length of (ENCDECD+N+STI) samples, wherein ENCDECD is the basic encoder plus decoder delay, STI is stuffing information (e.g. a number of zero-amplitude samples), and (N+STI) equals (m*block length), m being an integer number, i.e. a multiple of the block or frame length on which the processing in the audio encoder or decoder is based. The final start and end time instants of the decoded audio signal are derived from the basic encoder and decoder processing delay value and from the total length value, whereby the stuffing samples or bits (corresponding to STI) at the end of the data stream or track and the samples corresponding to the processing delay ENCDECD at the start of the data stream or track are discarded.

Figure 3:
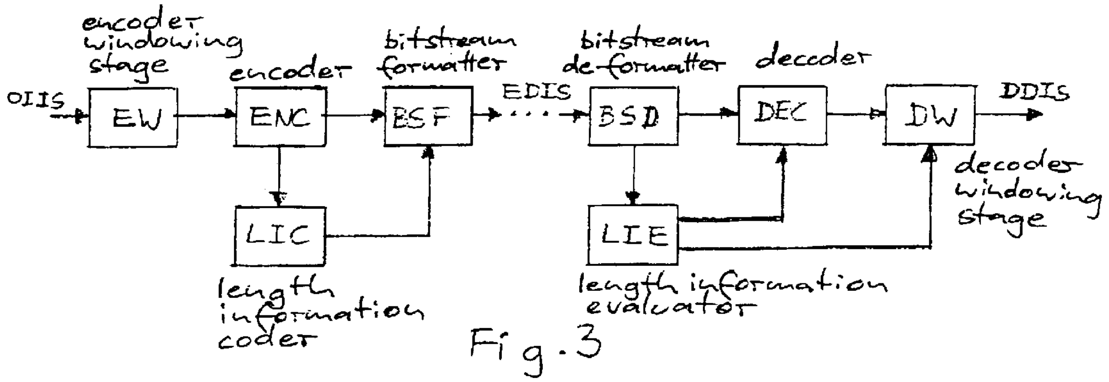
FIG. 3 Inventive encoder and decoder.
Figure 4:
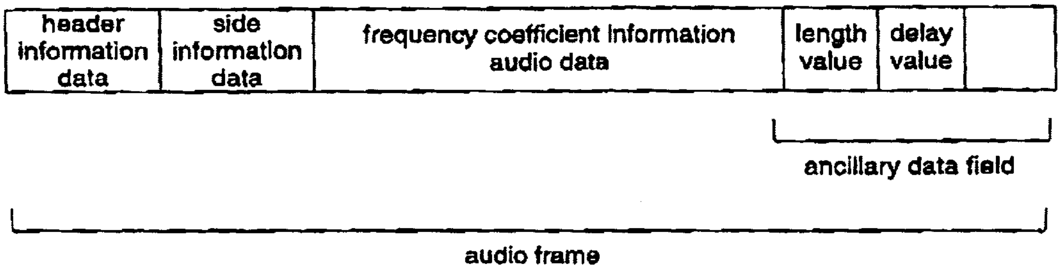
FIG. 4 An illustration of an audio frame containing encoded audio data and ancillary data.

The left part of FIG. 3 shows an inventive encoder receiving an original audio signal that is windowed in the time domain, or subband-filtered, in a corresponding encoder windowing stage EW, and is thereafter encoded using data reduction in an encoder stage ENC. From stage ENC, or alternatively from stage EW, or in bitstream formatter BSF, a total-length information is provided to a length information coder LIC, the output signal of which is combined with the frequency domain output signal of stage ENC in bitstream formatter BSF. Additionally a basic encoder delay value can be added to the bitstream in bitstream formatter BSF.

The right part of FIG. 3 shows an inventive decoder, receiving an encoded audio signal that includes a total-length information value or in addition a basic encoder delay value. Alternatively, if the basic encoder delay is fixed and known, it can be input for evaluation in the decoder itself. The bitstream de-formatter BSD extracts and provides the received total-length information value to a length information evaluator LIE that feeds the required total length information—optionally together with the basic encoder delay information or in addition with the basic decoder delay information—to a decoder windowing stage DW and/or to a decoder stage DEC. Alternatively, the basic encoder delay information or the basic decoder delay information can be provided from any other source to DW and/or to DEC. Stage DEC carries out the main decoding operations for the audio signal code received from stage BSD. The time domain output signal of stage DEC is thereafter windowed correspondingly to the encoder windowing in stage EW. In case of subband encoding/decoding, the synthesis filter DW converts the audio signal from the frequency domain back to the time domain. Between stages BSF and BSD a recording unit or a broadcast or cable transmission channel is passed.

Instead of a digital audio signal any other information signal can be processed, e.g. a digital video signal.

What is claimed is:

1. A method for encoding information representing an audio signal of an arbitrary length comprising the steps of:

encoding the information representing the audio signal into a plurality of blocks, inserting a length value into an ancillary data field in at least one block of the plurality of blocks, wherein the length value is a value indicating the total length of the audio signal before the encoding step.

2. The method of claim 1, wherein a summed up length-of the plurality of blocks is a multiple of a predetermined length.

3. The method of claim 2, wherein the value indicating the total length of the audio signal is capable of being used by a decoder to adjust a length of a block corresponding to a decoded audio signal decoded from the plurality of blocks such that a total length of the decoded audio signal equals the total length of the audio signal before the encoding step.

4. The method of claim 1, wherein the ancillary data additionally comprises a value corresponding to a time delay value of the encoding step.

5. The method of claim 4, wherein the time delay indicates the delay due to an encoding operation using at least one of: a short time transform processing operation and use of filters for splitting the audio signal into frequency bands.

6. The method of claim 1, wherein the ancillary data is inserted in at least one of: a first block of the plurality of blocks, one of the first blocks of the plurality of blocks, a last block of the plurality of blocks, and a second to last block of the plurality of blocks.

7. A method for decoding information representing an audio signal of an arbitrary total length comprising the steps of:

decoding the information representing the audio signal from a plurality of blocks into a decoded audio signal; wherein a total length of the decoded audio signal is adjusted to equal a total length of the audio signal before the audio signal was encoded into the plurality of blocks by using auxiliary information inserted into a block of the plurality of blocks; and the auxiliary information comprises a value indicating the total length of the audio signal before encoding.

8. The method of claim 7, wherein a summed up length of the plurality of blocks is a multiple of a predetermined length.

9. The method of claim 7, wherein the auxiliary information additionally comprises a value corresponding to time delay of when the audio signal was encoded into the plurality of blocks.

10. The method of claim 9, wherein the time delay indicates the delay due to an encoding operation using at least one of: a short time transform processing operation and use of filters for splitting the audio signal into frequency bands.

11. The method of claim 7, wherein the auxiliary information is inserted in at least one of: a first block of the plurality of blocks, one of the first blocks of the plurality of blocks, a last block of the plurality of blocks, and a second to last block of the plurality of blocks.

12. An apparatus for encoding an audio signal of a total length comprising:

an encoder for windowing the audio signal;

a data reduction encoder for reducing a size of the encoded audio signal resulting in a frequency domain output signal;

a bitstream formatter for combining the frequency domain output signal with auxiliary information indicating a value corresponding to an arbitrary total length of the audio signal before encoding, wherein the output of the bitstream formatter is a plurality of blocks.

13. The apparatus of claim 12, wherein the value corresponding to the total length of the audio signal, before encoding by the claimed apparatus, is determined by a length information encoder.

14. The apparatus of claim 12, wherein a value corresponding to a time delay of when the audio signal was encoded into the plurality of blocks is inserted into the plurality of blocks by the bitstream formatter.

15. An apparatus for decoding a plurality of blocks representing an audio signal comprising:

a bitstream de-formatter that extracts information corresponding to an arbitrary total length of the audio signal before the audio signal was encoded;

a length information evaluator that is responsive to the information corresponding to the total length of the audio signal for controlling a total length of an output audio signal derived from the plurality of blocks;

a decoder that windows the plurality of blocks into the output audio signal with the total length of said outputted audio signal being equal to the total length of the audio signal before the audio signal was encoded, as determined by the length information evaluator.

16. The apparatus of claim 15, wherein said windowing of the plurality of blocks into the output audio signal involves a decoding operation from the frequency domain to the time domain.

17. The apparatus of claim 15, wherein a value corresponding to a time delay of when the audio signal was encoded into the plurality of blocks is inserted into the plurality of blocks and is extracted by the apparatus for the windowing operation of the decoder.

* * * * *

UNITED STATES PATENT AND TRADEMARK OFFICE

CERTIFICATE OF CORRECTION

PATENT NO. : 6,903,664 B2
DATED : June 7, 2005
INVENTOR(S) : Schroder et al.

It is certified that error appears in the above-identified patent and that said Letters Patent is hereby corrected as shown below:

Title page,
Item [56], References Cited, U.S. PATENT DOCUMENTS, add the following:

| | | | |
|---|---|---|---|
| -- 4,573,034 | 2/1986 | Schouhamer Immink | 340/347 |
| 5,109,417 | 4/1992 | Fielder et al. | 381/36 |
| 5,790,057 | 8/1998 | Linde et al. | 341/68 |
| 6,310,897 | 10/2001 | Watanabe et al. | 370/522 --. |

OTHER PUBLICATIONS, add the following:
-- John Watkinson, "The Art of Digital Audio", New Scientist Second Edition, 1988, pp. 4-11. --.

Signed and Sealed this

Thirtieth Day of August, 2005

JON W. DUDAS
*Director of the United States Patent and Trademark Office*